United States Patent [19]
Kianush et al.

[11] Patent Number: 5,450,621
[45] Date of Patent: Sep. 12, 1995

[54] RADIO RECEIVER WITH DIGITAL CONTROL LOOP FOR COARSE FREQUENCY ACQUISITION AND ANALOG CONTROL LOOP FOR FREQUENCY LOCK-IN

[75] Inventors: Kaveh Kianush; Engelbertus C. J. Egelmeers; Johannes C. M. Meeuwis; Hubertus H. M. Vereijken, all of Eindhoven, Netherlands

[73] Assignee: U.S. Philips Corporation, New York, N.Y.

[21] Appl. No.: 107,544

[22] Filed: Aug. 17, 1993

[30] Foreign Application Priority Data

Aug. 18, 1992 [EP] European Pat. Off. ............ 92202520

[51] Int. Cl.[6] .............................................. H04B 1/16
[52] U.S. Cl. ............................ 455/192.2; 455/164.2; 455/182.2; 455/182.3; 455/184.1; 455/185.1; 455/192.3; 455/196.1
[58] Field of Search ............... 455/164.1, 164.2, 169.1, 455/182.1–182.3, 183.2, 184.1, 185.1, 192.1–192.3, 196.1, 197.1; 348/536, 731, 735

[56] References Cited

U.S. PATENT DOCUMENTS

| | | | |
|---|---|---|---|
| 4,184,121 | 1/1980 | Tanaka | 455/182.2 X |
| 4,344,187 | 8/1982 | Ogita et al. | |
| 4,374,437 | 2/1983 | Citta et al. | 455/182.2 X |
| 4,476,580 | 10/1984 | Tanaka et al. | 455/164.2 |
| 4,955,075 | 9/1990 | Anderson | |

OTHER PUBLICATIONS

"AM/FM Radio Receiver Circuit", TEA5592, Philips Data Handbook Radio, audio and associated systems Bipolar, MOS, Book IC01, 1991, pp. 1047–1060.

Primary Examiner—Edward F. Urban
Assistant Examiner—Chi H. Pham
Attorney, Agent, or Firm—Leroy Eason

[57] ABSTRACT

Manually tunable analog receivers with AFC have the drawback that the AFC exhibits hysteresis and that in the event of fading pulling to an adjacent station may occur, whereas receivers with PLL electronic tuning have the drawbacks that tuning is comparatively slow and also inaccurate because of the tuning in discrete steps by a microprocessor. The present receiver combines the advantages of both analog manual tuning and electronic tuning. It includes two cooperating frequency loops, one loop (L1) being an AFC loop and the other loop (L2) having a frequency counter (13) for measuring the frequency ($f_0$) of a tuning oscillator (6) which is controlled by both loops. Cooperation between the loops is provided by a control circuit (16) responsive to control signals supplied by both loops: an in-lock signal (in-1) and an in-window signal (in-w). Preferably, when the desired tuning is achieved, the power to a tuning section (12) of the receiver, forming part of the frequency loop (L2), is interrupted.

10 Claims, 3 Drawing Sheets

RADIO RECEIVER WITH DIGITAL CONTROL LOOP FOR COARSE FREQUENCY ACQUISITION AND ANALOG CONTROL LOOP FOR FREQUENCY LOCK-IN

BACKGROUND OF THE INVENTION

1. Field of the Invention

The invention relates to a receiver for receiving high-frequency signals, comprising a receiving section which includes a first frequency loop with a frequency conversion device for frequency conversion of a high-frequency modulated signal, to be applied to the receiving section, into a modulated signal of lower frequency, a detection device for detecting an information signal present in the modulated signal of lower frequency, and a tuning oscillator which is coupled to the frequency conversion device and whose frequency can be adjusted by means of a first tuning control signal which can be supplied by a first tuning control signal generator coupled to the detection device. A receiver of this kind may be a radio receiver, a television receiver, a video recorder, or a cordless or mobile telephone.

2. Description of the Related Art

A receiver of this kind in the form of a radio receiver is known as an integrated "AM/FM Radio Receiver Circuit", TEA5592, described in the Philips Data Handbook "Radio, audio and associated systems Bipolar, MOS", Book IC01, 1991, pp. 1047–1060. An application of this IC is shown on page 1057 of said handbook, i.e. as an AM/FM radio receiver from aerial signal to low-frequency or audio signal. Tuning of the AM/FM radio receiver is performed manually by means of two ganged capacitors. For FM there is provided a tuning control signal generator FM-AFC, as shown on pages 1049 and 1057, which is coupled to the FM discriminator which serves as demodulator. The FM-AFC supplies a tuning control signal for the FM tuning oscillator which is coupled to a frequency conversion device, in this case being an FM mixer whereto a high-frequency modulated signal can also be applied. The tuning control signal serves to adjust the oscillator frequency, within a given range, so that fine tuning is achieved after manual tuning which could otherwise lead to imperfect tuning to a radio station. Therefore, there is provided a first frequency loop which serves for fine tuning to a radio station to be listened to. The AFC ("Automatic Frequency Control"), ensures that despite drift phenomena due to temperature effects, voltage variations and the like, the frequency of the tuning oscillator retains a value enabling optimum operation of further signal processing means, such as an intermediate frequency stage in a superheterodyne receiver. The AFC utilizes the so-called S-curve FM discriminator characteristic. Any variation from the central frequency of the FM discriminator gives rise to DC voltage variations at the output of the discriminator, with a polarity which is determined by the direction of the frequency deviation. This DC component is separated from the desired discriminator output signal by means of a low-pass filter, after which it is applied to the local oscillator so that the frequency of the local oscillator is varied in a direction tending to correct the error in the mean intermediate frequency. Tuning errors due to inter alia drift phenomena can thus be eliminated to a high degree and accurate tuning is achieved, any selective intermediate frequency amplifiers present in the radio then operating optimally in respect of signal processing. It is a drawback of the known AFC that hysteresis occurs in the tuning, i.e. notably in the case of a busy frequency band it is difficult to tune to a desired station because, depending on the search direction in the frequency band, the AFC often acts on a station in the immediate vicinity of the desired station. A further drawback consists in that in the case of fading, i.e. a temporary strong reduction of the signal received, notably of importance for portable radio receivers such as portable broadcast receivers and radio receivers in cordless telephones or car telephones, so-called "pulling" to a neighbouring station or radio channel can occur under the influence of the AFC.

From U.S. Pat. No. 4,344,187 there is also known an electronically tunable radio receiver in which the tuning function is provided by a phase locked loop synthesizer which cooperates with an AFC in an intricate manner, thus precluding suitable compromise between the respective loop parameters. The AFC is switched on only when a signal of adequate strength is received; this is detected via a muting control function. Using the PLL tuning, radio stations in a frequency band are stepwise searched, the frequency steps being adjusted by means of a programmable divider in the PLL. Even though not shown, control signals for tuning in such electronically tunable radio receivers are usually supplied by a microprocessor. The operation of such PLL tuning is as follows. The phase of the signal of the voltage-controlled tuning oscillator, divided by a dividend, is compared with the phase of a reference clock signal which is generated by a crystal oscillator. The error signal of the phase comparator, being a series of narrow pulses, is integrated in a loop filter which supplies a control voltage for the local oscillator. A different tuning frequency can be chosen by adjustment of a different dividend. A drawback which is of importance notably in portable receivers consists in that the programmable divider has a comparatively high power consumption, inter alia because of the feedbacks in the divider which are required for implementing arbitrary dividends. Moreover, the PLL should be carefully designed in respect of noise behaviour in order to ensure that the local oscillator signal-to-noise ratio is not restricted by the tuning system. Furthermore, due to the skipping of narrow pulses in the case of small phase errors, the charge pump in the loop has a dead zone, so that the output signal of the local oscillator exhibits drift phenomena. The PLL residual errors due to this dead zone have a comparatively large bandwidth, so that the time constant of the filter should be comparatively large so as to filter out resultant interference signals, thus leading to a slower tuning system. Therefore, a compromise must be found between interference and speed. Integration of the tuning system with the receiving section in one integrated circuit also poses major problems because of the interference between the tuning system and a receiving section. Because of the step-wise tuning, the tuning quality obtained is inferior to that obtained in radio receivers with manual tuning and AFC, like said TEA5592. Furthermore, PLL tuning is comparatively slow; this is a drawback notably for application in RDS car radios and in cordless telephones or mobile radios. Moreover, PLL implementations in integrated form still require a comparatively large number of external components.

SUMMARY OF THE INVENTION

It is an object of the invention to provide a receiver of the kind set forth which comprises digital tuning means and in which the advantages of a manually tunable analog receiver are combined with the possibilities offered by known electronically tunable receivers, without incurring the drawbacks of both types of receivers, i.e. to provide fast and accurate tuning which is also comparatively simple and inexpensive.

A receiver in accordance with the invention is characterized in that the receiver comprises a tuning section which includes a second frequency loop with a frequency measuring device for measuring the frequency of the tuning oscillator and a second tuning control signal generator which can be coupled to the frequency measuring device and which serves to generate a second tuning control signal to be applied to the tuning oscillator, the receiver comprising a control device with which the first frequency loop can be closed at least in dependence on a first control signal to be supplied by the receiving section. A digital tuning structure is thus obtained which is capable of operating continuously instead of step-wise, information in respect of the tuning quality being dynamically applied, via the AFC, to the tuning section. By using the second, digital frequency loop and suitably chosen control signals, a fast tuning system is obtained which has the accuracy of manual tuning with AFC. Furthermore, the tuning system can operate in different modes by simple adaptation, for example manual tuning, preset, or automatic search, in combination with automatic storage of frequencies of stations found (autostore) or not. Fine tuning is in principle provided by the first frequency loop, coarse tuning being provided by the second frequency loop, at least in the preset mode, the control device providing the necessary interaction between the two loops. In comparison with a programmable divider in a PLL, the frequency measuring device can be simply integrated and also has a substantially lower power consumption.

The tuning system in accordance with the invention is based on the behaviour of an operator of a manually tuned analog receiver. The tuning system first adjusts the oscillator frequency coarsely to the desired channel and subsequently achieves the best reception by fine tuning, the oscillator frequency preferably being varied at a speed which is in conformity with the frequency distance yet to be bridged, until the desired station is reached.

It is also to be noted that a combined AFC with PLL is known from U.S. Pat. No. 4,955,075, but, apart from the fact that it concerns a PLL, therein switching over from AFC to PLL and vice versa takes place on the basis of a control signal obtained from signal strength measurements of the highfrequency modulated signal instead of on the basis of internal operation.

An embodiment of a receiver in accordance with the invention is characterized in that in the preset mode, in which the frequency measuring device is preset to a desired channel, the frequency measuring device is coupled to the second tuning control signal generator. The second frequency loop is closed by the control unit on the basis of a second control signal supplied to the control device by the frequency measuring device, for coarse tuning, the second tuning control signal is substantially active outside a frequency window around the desired channel for fine tuning the first tuning control signal is substantially active at least within the frequency window control unit controls a change-over from coarse tuning to fine tuning on the basis of the first and the second control signal. As a result, first fast coarse tuning and subsequently slower fine tuning is achieved, without the risk of "pulling" to a neighbouring channel. The amplitude of the first tuning control signal, the AFC signal, varies linearly as a function of the frequency. Outside the frequency window, the second tuning control signal preferably has a constant, positive and negative amplitude, respectively, and has a value zero within the frequency window.

A further embodiment of a receiver in accordance with the invention, intended to increase the tuning speed of the coarse tuning, is characterized in that for coarse tuning further frequency windows are provided around the desired channel, the first tuning control signal being substantially active at least within the inner frequency window, the second tuning control signal being more active during coarse tuning as the frequency of the tuning oscillator is in tuning windows situated further from the desired frequency. It is thus achieved that coarse tuning is faster as the frequency of the tuning oscillator is further from the desired frequency.

A further embodiment of a receiver in accordance with the invention is characterized in that relative to the inner frequency window the further frequency windows constitute a geometrical distribution over the frequency band, the second tuning control signal being a current whose ratio of values over the frequency windows is the same as that of the weighting factors in respect of the geometrical distribution. Maintaining the stability of the tuning system, optimum coarse tuning is thus obtained in respect of speed. When two frequency windows are used, a very substantial increase of the speed of coarse tuning is achieved in comparison with the use of one frequency window. The further gain in speed from the use of three frequency windows is marginal. This multi-frequency concept again simulates a manual tuning procedure, i.e. when the desired channel is still situated far from the current channel, the user will first quickly turn the tuning nob and subsequently ever slower as the frequency distance from the desired channel becomes smaller. In other words, the tuning system operates in conformity with human perception.

An embodiment of a receiver in accordance with the invention is characterized in that frequency measuring periods of the frequency measuring device for measuring the frequency of the tuning oscillator are adapted in proportion to the frequency windows. The speed of the tuning system is thus further increased. This adaptation is based on the idea that tuning time is unnecessarily wasted by performing the measurement constantly with the measuring time of the inner frequency window. Calculations demonstrate, that for a ratio of receiving bandwidth to single-sided first frequency window amounting to 1000 and using three frequency windows, the gain in speed in comparison With the use of one frequency window amounts to a factor 33 in the case of geometrical frequency windows, whereas the gain in speed amounts to a factor 200 when the frequency measuring times are further adapted.

A further embodiment of a receiver in accordance with the invention is characterized in that the power to the tuning section is interrupted when the first and second control signals inform the control device that the frequency of the tuning oscillator is situated within the frequency window, or within the inner frequency window in the event of a plurality of windows, as well as within the capture range of the first tuning control signal generator. Because of the fact that the remaining currentcarrying control circuits, which may be constructed as low-power circuits, carry comparatively little current with respect to the receiving section, a tuning system is thus obtained which requires substantially the same amount of energy as an analog manual tuning system with AFC in the tuned condition. Furthermore, interference no longer exists between the tuning section and the receiving section.

A further embodiment of a receiver in accordance with the invention is characterized in that before the power to the tuning section is interrupted, the last channel frequency measured is stored in a last-channel memory. Should undesirable effects such as fading or pulling occur upon deactivation of the tuning section and should the current to the tuning section be restored again because of disappearance of the first control signal, the tuning section can directly respond to these undesirable effects, utilizing the last channel frequency measured which is stored in the last-channel memory, so that very firm control is obtained.

A further embodiment of a receiver in accordance with the invention is characterized in that the first tuning control signal generator is decoupled from the tuning oscillator when the frequency of the tuning oscillator is outside the frequency window, or, outside the inner frequency window in the event of a plurality of windows, the second frequency loop being subsequently activated. "Pulling" in the event of inter alia fading is thus prevented.

An embodiment of a receiver in accordance with the invention is characterized in that in the search mode, in which an arbitrary channel is searched within a frequency band, the power to the frequency measuring device is interrupted and the frequency measuring device is decoupled from the second tuning control signal generator, that the second tuning control signal generator directly controls the tuning oscillator so as to scan the frequency band, that the control device interrupts the search, on the basis of a control signal to be supplied by the first tuning control signal generator, when a channel containing a signal is tuned to, and that subsequently the frequency measuring device is activated so as to measure the frequency of the tuning oscillator and to store the measured frequency in a last-channel memory, after which the control device interrupts the power to the tuning section. Because the frequency measuring device does not receive power and is decoupled during the search mode, no interference occurs with the receiving section, so that it is impossible to stop at incorrect positions within the frequency band. When a station has been found, after frequency measurement and storage the tuning system enters the standby mode, so that the receiver as a whole has an as low as possible power consumption. Because of the storage of the frequency of the tuned channel, quick response to fading and pulling is again possible, so that a firm tuning system is realised also in the search mode. A microprocessor, if any, in the receiver, therefore, in principle has no other tasks than to scan a control panel and to control a display panel such as an LCD screen. The automatic search is fast because the smaller amount of tuning software and hence the substantially shorter communication procedure, like in known electronic tuning systems between the microprocessor and the synthesizer.

BRIEF DESCRIPTION OF THE DRAWINGS

The invention will be described in detail hereinafter with reference to the drawings; therein

DESCRIPTION OF THE DRAWINGS

Figure 1:
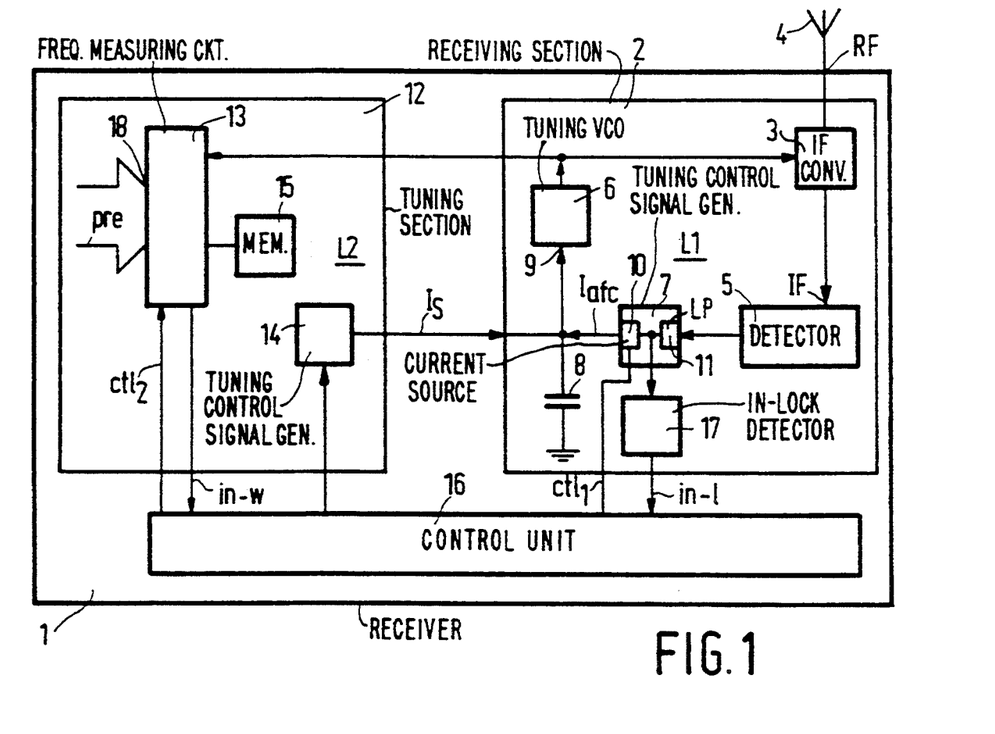
FIG. 1 shows a block diagram of a receiver in accordance with the invention.

FIG. 1 shows a block diagram of a receiver 1 in accordance with the invention. The receiver 1 comprises a receiving section 2 which includes a first frequency loop L1 with a frequency conversion device 3 for frequency conversion of a high-frequency modulated signal RF, to be applied to the receiving section 2 via an aerial 4, into a modulated signal IF of lower frequency. The frequency loop L1 also comprises a detection device 5 for detection of an information signal present in the modulated signal of lower frequency IF, for example a radio or television broadcast signal or a telephone signal, and a tuning oscillator 6 which is coupled to the frequency conversion device 3 and whose frequency can be adjusted by means of a first tuning control signal $I_{afc}$ to be supplied by a first tuning control signal generator 7 coupled to the detection device 5. The tuning control signal generator may comprise a controlled current source 10 which applies a tuning control signal Iac in the form of a current to a loop filter 8, preferably an integrator, which is formed by a capacitor for integration of the current $I_{afc}$, so that there is formed a control voltage $\int I_{afc}.dt$ for supply to a control input 9 for controlling the tuning oscillator 6, being a VCO (Voltage Controlled Oscillator) in the present embodiment. The tuning control signal generator 7 also comprises a low-pass filter 11 which filters an output signal of the detection device 5, for example an FM discriminator, and outputs it as a control signal for the controlled current source 10. In a superheterodyne receiver the frequency conversion device 3 may be a customary mixing stage for mixing the high-frequency modulated signal RF so as to form the modulated signal of lower frequency IF, being an intermediate frequency, for example 10.7 MHz in the event of broadcast FM. Conventional selective intermediate frequency amplifiers comprising fixed filter sections, then present in the receiving section 2, are assumed to be included in the detection device 5 for the sake of simplicity. Other customary structures are also feasible for the receiving section 2, as long as a suitable control signal can be applied to the tuning oscillator 6 for frequency tuning thereof in the first frequency loop L1. The invention is not restricted to FM modulated signals, other modulation types such as AM and PM also being possible. In addition to a superheterodyne structure, for example a receiving section 2 based on a so-called direct-conversion structure which is very well suitable for integration is also feasible. In order to minimize tuning errors in the receiving section 2 per se, caused by DC offsets and leakage currents in the AFC loop, the current source 10 should have a very high output impedance; this can be achieved, for example by choosing a so-called Wilson current mirror configuration in which an input current is applied to a conventional current mirror configuration but an output current is supplied via an output transistor in cascode connection with a mirror transistor. The input current of the current source 10, supplied via the low-pass filter 11, can then be delivered by a voltage/current converter (not shown) coupled to symmetrical outputs of the detector 5.

The receiver also comprises a tuning section 12 which includes a second frequency loop L2 with a frequency measuring device 13 for measuring the frequency of the tuning oscillator 6, and a second tuning control signal generator 14 which can be coupled to the frequency measuring device 13 and which serves to generate a second tuning control signal $I_s$ to be applied to the tuning oscillator 6. A measured frequency of the tuning oscillator 6 can be stored in a last-channel memory 15. The receiver also comprises a control unit 16 for controlling the receiving section 2 and the tuning section 12. In the preset mode (preset tuning) of the receiver 1, the control unit 16 will, in a manner in accordance with the invention yet to be described, control and/or open or close the first and/or the second frequency loop, i.e. in this mode both frequency loops L1 and L2 are active. During operation of the receiver 1 in the search mode (auto-search tuning), in given circumstances only the first frequency loop L1 is active, the frequency measuring device 13 being used to measure the frequency of the relevant station after a station has been found. The control unit 16 can close the frequency loop L1 at least in dependence on a first control signal in-l (in-lock signal) to be supplied by the receiving section 2. Depending on the mode of operation of the receiver, the control unit 16 controls the first and/or the second frequency loop L1 and L2 also on the basis of a second control signal in-w (in-window signal) to be applied to the control unit 16 by the frequency measuring device 13. The in-lock signal in-l is formed, by an in-lock detection device 17, from the AFC signal from the detection device 5 which is filtered by the low-pass filter 11. The in-lock detection device 17, being described in detail in the published European Patent Application No. 92202519.2 filed Aug. 18, 1992, which corresponds to co-pending U.S. application Ser. No. 08/108,018, filed concurrently herewith, assigned to the same assignee. It supplies a reliable in-lock signal, indicating that the first frequency loop has been adjusted with a given accuracy, by very accurate analysis of the so-called S-curve which is integrated by loop filter 8 to obtain a voltage for adjusting. The control unit 16 also supplies the current source 10 and the frequency measuring device 13 with control signals ct11 and ct12 for respective control and on/off switching. The control unit can also autonomously control the second tuning control signal generator 14, which may be a controllable charge pump having several control inputs, in the autosearch mode. The frequency measuring device 13 may be a programmable counter having a preset input 18 for receiving a digital preset signal pre which can be supplied by a microprocessor (not shown) or also, in a simple and inexpensive embodiment of the receiver 1 in accordance with the invention, by a hardware preset device consisting of a number of flipflop registers. Such a simple embodiment can be implemented in comparatively inexpensive portable broadcast receivers. The presets can be adjusted during the auto-search mode or also via a frequency which can be entered via a keyboard and which is loaded into the preset registers after having been digitized.

Figure 2:
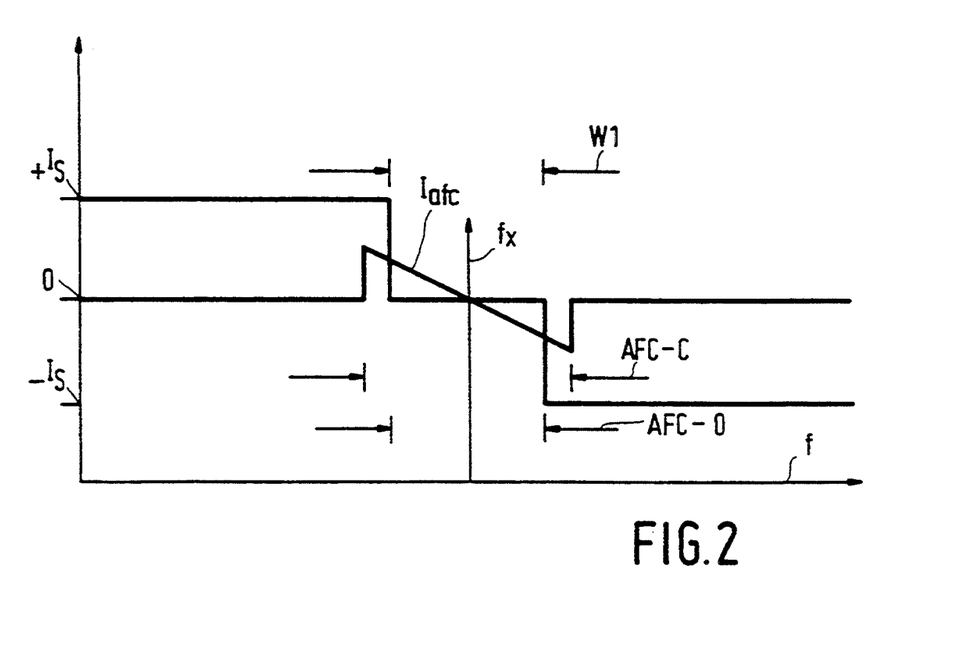
FIG. 2 shows control currents in a receiver in accordance with the invention as a function of the frequency.

FIG. 2 shows the control currents $I_{afc}$ and $I_s$ in a receiver 1 in accordance with the invention as a function of the frequency f. The control current 1, varies non-linearly as a function of the frequency f relative to the desired frequency $f_x$, and has a positive value $+I_s$ or a negative value $-I_s$ outside a frequency window or tuning window W1 for coarse tuning which should be narrower than half the channel spacing. Also shown is an AFC capture range AFC-C within which $I_{afc}$ varies linearly and beyond which $I_{afc}$ has a value zero, and also an AFC operating range AFC-O within the AFC capture range AFC-C. The actual polarity depends on signal inversions, if any, present in the loops L1 and L2, i.e. taking into account the correct control effect, polarities may be reversed.

Referring to FIG. 1, in the preset mode the loops L1 and L2 for coarse tuning and fine tuning, respectively, cooperate as follows. The receiving section 2 compares and correlates the output signal of the tuning oscillator 6 with the high-frequency modulated signal RF and generates the control current lag on the basis thereof. If the error is comparatively small, the in-lock signal in-l is generated in the in-lock detection device 17. The tuning section 12 also executes a frequency comparison, be it in respect of the desired preset signal pre. The tuning section 12 acknowledges that coarse tuning has been achieved by way of the in-window signal in-w which indicates that the oscillator frequency of the tuning oscillator 6 is within the frequency window W1. In the preset mode it is desirable to have an in-lock window which is wider than the tuning window W1, whereas in the autosearch mode a narrow in-lock window is desirable to avoid the missing of channels. When a different station is desired in the preset mode, the tuning section 12 supplies a constant current which is integrated by loop filter 8 to obtain a voltage for adjusting the tuning oscillator 6 coarsely to the correct frequency, free tuning being subsequently provided by the AFC loop L1. The operating ranges of the loops L1 and L2 in principle exclude one another, as shown in FIG. 2, the in-lock and in-window signals being used to coordinate the transition from one loop to the other loop and vice versa. Correct reception of the desired signal is achieved when the tuning section 12 is "in-window" and the receiving section is "in-lock". The tuning process has then been completed and the power to the tuning section can be interrupted, resulting in a substantial saving of power. The latter is important notably for portable receivers. Because annoying interference between the receiving section 2 and the tuning section 12 is no longer experienced, the receiving section 2 can be more readily integrated with the tuning section 12 on a single IC, together with the control section 16, and the number of external components can also be reduced. When the receiver 1 is used as a portable receiver, the field strength of the high-frequency signal RF received will continuously vary in practical situations, its strength being dependent notably on the relevant frequency band. This may give rise to undesirable effects, such as fading and pulling to an adjacent channel. In order to solve this problem, the frequency of the signal received is written into the last-channel memory 15 after correct tuning and before the power to the tuning section 12 is interrupted. Such a memory 15 may be SRAM having a very low power consumption. In the event of fading or pulling, the in-lock signal temporarily disappears. The control device immediately responds thereto by restoring the power to the tuning section 12. The tuning section 12 then measures the frequency of the tuning oscillator 6 again, utilizing the information stored in the last-channel memory 15, and makes the necessary corrections in the described manner.

Figure 3:
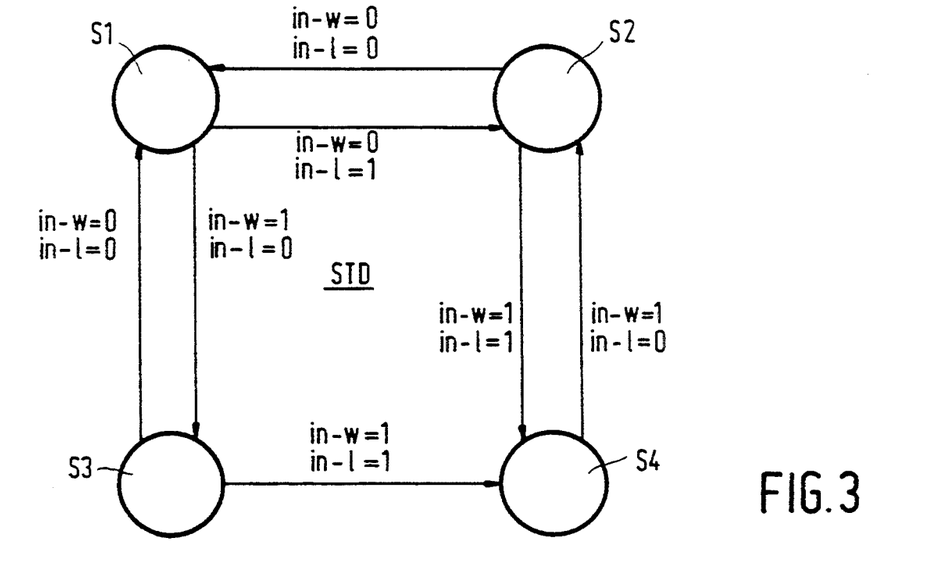
FIG. 3 shows a state diagram for control currents in a receiver in accordance with the invention.

FIG. 3 shows a state diagram STD for control currents $I_{afc}$ and $I_s$ in a receiver 1 in accordance with the invention for operation of the receiver in the preset mode. A description on the basis of the state diagram STD substantially simplifies the design of the two-loop structure in respect of stability and tuning speed. The Figure shows a pre-acquisition state S1, in which the control current source $I_s$ supplies current and $I_{afc}$ does not supply current, an acquisition or fading state S2 in which the current Is is not "in-window" W1 and the current $I_{afc}$ is "in-window" W1, a no-signal state S3 in which the current source $I_s$ does not supply a current and the current source $I_{afc}$ supplies a current, and the post-acquisition state or state of desired tuning S4 in which the current source $I_s$ does not supply a current and the current source $I_{afc}$ supplies a current. Other changes of state can be represented in a similar manner. Changes of state are denoted by arrows, the control signals in-w and in-l, and 0 and 1, respectively, adjacent each arrow indicating whether the desired frequency is "in-lock" and/or "in-window".

Figure 4:
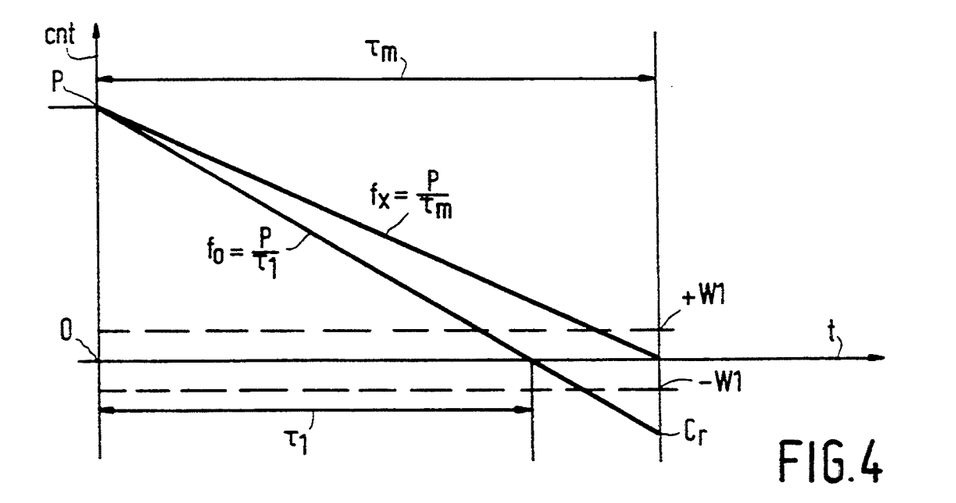
FIG. 4 shows a measuring cycle of a frequency measuring device in a receiver in accordance with the invention.

FIG. 4 shows a measuring cycle of a frequency measuring device 13 in a receiver 1 in accordance with the invention, in which an initial value count of the frequency measuring device 13, for example being a programmable counter, is plotted as a function of time t. The count represents a frequency and P is a binary representation of the preset value of the preset signal pre. The counter 13 measures the frequency $f_0$ of the tuning oscillator 6 relative to the desired frequency $f_x$. First the preset signal pre is loaded into the counter 13 and subsequently the counter counts down for a predetermined reference period $\tau_m$ (down counting). At the end of the measuring period $\tau_m$, the counter residue Cr is compared with the defined tuning frequency window $+W1$ to $-W1$. Depending on the sign of the residue Cr, the current source 14 generates a correction current $+I_s$ or $-I_s$, which current is integrated by the loop filter 8 so as to form a voltage whereby the tuning oscillator 6 is controlled. The gain of the tuning oscillator then amounts to $K_0$. A practical embodiment will be described with reference to the FIGS. 6 and 7. Because of the non-linear nature of the charge pump 14, the frequency of the tuning oscillator will continuously vary during the tuning cycle. The frequency counter 13, however, should continuously measure the frequency of the tuning oscillator 6 in order to decide whether or not the frequency is "in-window". If the time in which the frequency sweep of the tuning oscillator 6 across one tuning window exceeds the measuring period $\tau_m$ the tuning system becomes unstable. For a stable system, the measuring time delay $\tau_m$ should be smaller than or equal to the loop delay $\tau_1$. It can be deduced that for a stable system:

$$\tau_m \leq \frac{2 \cdot W1 \cdot C}{K_0 \cdot I_s}$$

where C is the capacitance of the loop filter 8. If the frequency $f_0$ of the tuning oscillator 6 equals the desired frequency $f_x$, the counter 13 will count down exactly to 0 during the measuring period $\tau_m$. The gradient of the down-count is thus a measure for the actual frequency $f_x$. The counter 13 is controlled by a clock signal. The estimation of the frequency of the tuning oscillator 6 is an integral over the clock pulses, containing this gradient, over the measuring period $\tau_m$, or: mathematical expression:

$$\int_0^{\tau_m} (P/\tau_m) \cdot dt$$

In reality, instead of a linear relationship a discrete relationship exists, but if the word length of the counter 13 is sufficiently long, the linear approximation is quite satisfactory. When the tuning oscillator 6 is adjusted exactly correctly, the value of the integral will be equal to P at the end of the measuring period $\tau_m$, but in the event of incorrect adjustment relative to the desired frequency $f_x$, the estimate will be P. $\tau_m/\tau_1$, for example when the counter reaches a zero position after a period $\tau_1$. The frequency $f_0$ of the tuning oscillator 6 is "in-window" if the absolute value of $(P.((\tau_m/\tau_m)-1)$ is smaller than or equal to W1. In a dynamic situation, in which the tuning frequency varies continuously, the situation is more complex but it can be simply demonstrated that in the event of a linear frequency sweep of the frequency of the tuning oscillator 6 during the measuring period $\tau_m$, the same stability criterion holds as in a static situation as described. The stability criterion of the tuning loop L2 limits the maximum tuning speed at which tuning from one preset value to the other preset value can take place. In the case of a tuning system comprising one tuning window W1, in given circumstances the tuning speed may become too slow, for example, in the event of a frequency band comprising many channels, but the tuning speed can be very substantially increased by using more than one frequency window.

Figure 5:
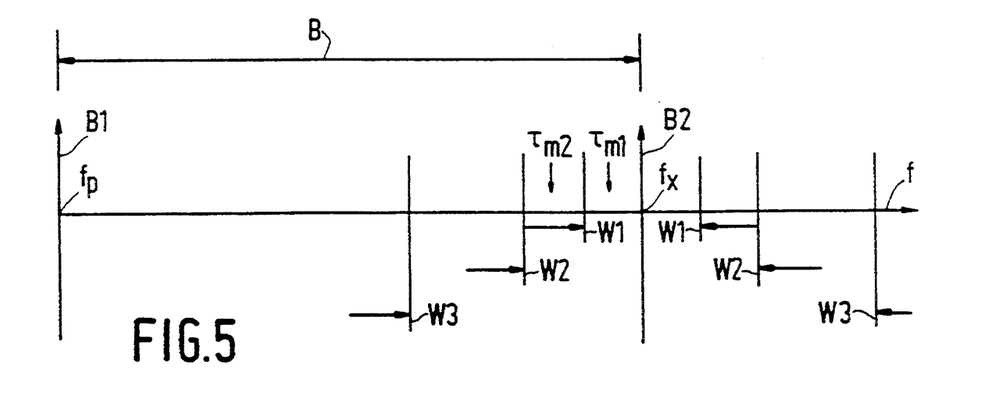
FIG. 5 shows a geometrical distribution of frequency windows over a frequency band.

FIG. 5 shows a geometrical distribution of frequency windows over a frequency band, as a function of the frequency f, where B is a receiving bandwidth with band edges B1 and B2, $f_x$ is a desired frequency, and W1, W2 and W3 are frequency windows in a tuning system in accordance with the invention which comprises more than one frequency window. A maximum frequency distance to be bridged is assumed, i.e. the current frequency $f_p$ is at one band edge B1 and the desired frequency $f_x$ is at the other band edge B2. It can be simply demonstrated that the maximum permissible tuning current is linearly proportional to the tuning window in view of stability requirements. Therefore, when a second, wider frequency window is used, a larger tuning current can be permitted for a part of the frequency distance to be bridged, stability still being maintained. An optimum situation of the second frequency window is obtained if B.W1=W2.W2, i.e. a situation in which equal tuning times are obtained for tuning from B1 to W2 and for tuning from W2 to W1.

When the frequency window is further increased, similar considerations apply, i.e. a mutually optimum situation of frequency windows is achieved in respect of tuning speed if the frequency windows are geometrically distributed over the receiving band, i.e. if:

$$W_n = W_1 \cdot \left(\frac{B}{W_1}\right)^{\frac{n-1}{n}}$$

where n is an integer positive number greater than one. For an optimum tuning; system for the tuning currents in the respective frequency windows the same weighting factors hold as for the situation of the tuning windows. In the embodiment shown, comprising three frequency windows W1, W2 and W3 with a B/W1 ratio of 1000, a gain in the speed of tuning by a factor 33 is achieved relative to a tuning system comprising one frequency window in the event of an optimum choice of frequency windows and tuning currents. It has been assumed that the window detection mechanism is independent of the measuring time required by the frequency measuring device or the counter 13 for measurement of the frequency of the tuning oscillator 6. For a stable tuning system, the tuning current within a given frequency window may not be so large that the counter 13 no longer has a measuring point within the relevant frequency window, i.e. it would be a waste of measuring time if the counter were to have an inadequate resolution within a frequency window, because the effective width of the frequency window would then be reduced and hence aim the total system response. An excessively high counter resolution, however, would result in an excessive measuring time. It can be simply demonstrated that the optimum resolution of the counter 13 is $W_1/2$. Even though the tuning currents to be adjusted on the basis thereof are lower than the maximum currents permissible in view of stability, the tuning speed does not decrease in proportion but to a lesser extent, depending on the number of frequency windows used and on the receiving bandwidth. A further acceleration of the tuning process is achieved by abstaining from keeping the measuring period of the counter 13 in the windows constant, but varying it across the windows in a tuning system in accordance with the invention which comprises several tuning windows. For a tuning system comprising two windows, the measuring period is chosen to be $\tau_{m1}=1/W1$ for the inner window and $\tau_{m2}$ for the outer window, the choice for a larger number of windows being similar. It can be simply demonstrated that, utilizing also a variable measuring period, the tuning time of the tuning system comprising three windows amounts to only 1/200 of the tuning time of a tuning system comprising one window.

The receiver 1 in accordance with the invention can operate not only in the preset mode, but also in the so-called autosearch mode. During a first phase of the tuning process in the autosearch mode, the frequency counter 13 does not form part of the loop L2, the tuning current being adjusted directly by the control device 16 which applies a frequency sweep to the tuning oscillator 6. If a station is found during the frequency sweep in the next channel, the in-lock detection device 17 generates an in-lock signal in-l. The control device 16 confirms the in-lock signal in-l by immediately interrupting the tuning current, the loop L1 ensuring that the relevant station is tuned to as well as possible. Subsequently, the frequency measuring device 13 measures the frequency of the tuning oscillator 6 and writes the measured frequency into the lastchannel memory 15. The tuning process is then completed and the control device 16 interrupts the power to the tuning section 12 and monitors the loops L1 and L2 in the manner described with reference to the preset mode. In the (auto)search mode a number of stations can also be acquired which are stored as preset stations. The analog autosearch mode is much faster than a search process in a customary digital receiver comprising a microprocessor, because of the absence of the long communication procedure between the microprocessor and the synthesizer which is required in the latter case. In the autosearch mode in accordance with the invention, the speed of the tuning process is determined mainly by the in-lock delay which is determined by audiofiltering in the receiving section 2 which is situated ahead of the in-lock detection device 17. In FM receivers such filtering is required for audio signal suppression and in AM receivers for amplitude stabilization. The in-lock delay causes overshoot in the response of the tuning system, the overshoot being dependent on the in-lock delay and the frequency sweep speed in a manner substantially similar to the braking distance of a vehicle. The overshoot may not be greater than the width of the tuning window W1, because the tuning current is otherwise interrupted too late so that the station is missed.

The tuning section 12 can be fully integrated with the receiving section 2, together with the control device 16, the loop filter 8 for the loop L2, also used as the AFC filter for the loop L1, being reduced to simply a capacitor.

Figure 6:
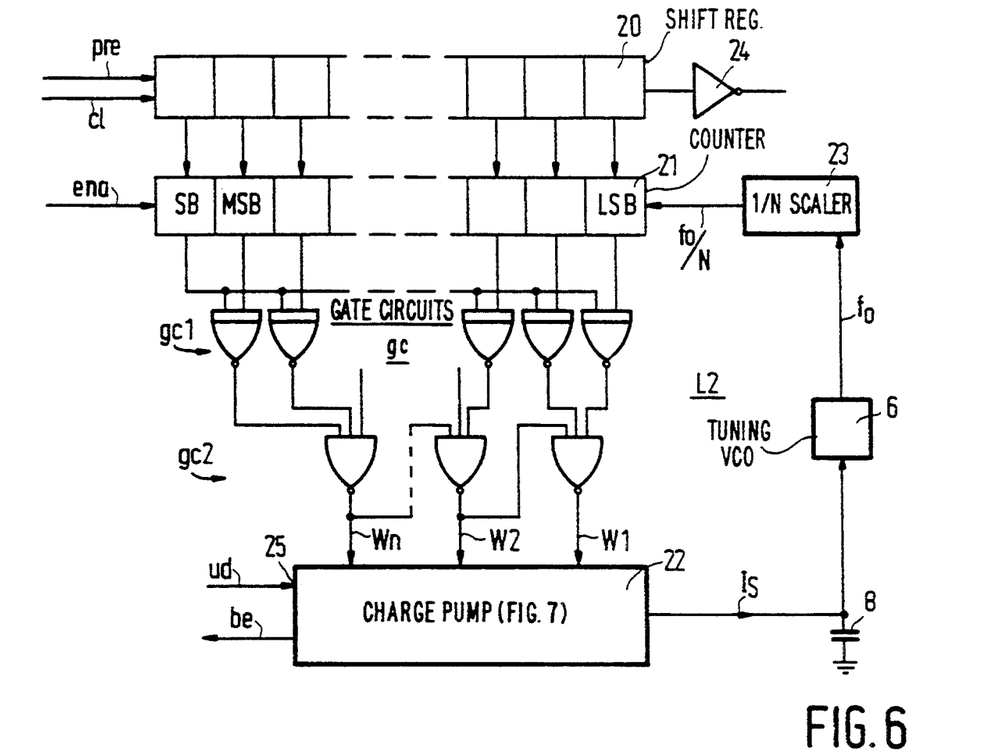
FIG. 6 shows an embodiment of a tuning section in a receiver in accordance with the invention.

FIG. 6 shows an embodiment of a tuning section 12 in a receiver 1 in accordance with the invention. The tuning section 12 comprises an input shift register 20 for receiving the preset signal pre, the control device 16 applying a clock signal c1 thereto for clocking the signal pre. The input shift register 20 is coupled at its output sides to inputs of an asynchronous counter 21 having a low power consumption. The preset signal pre can be presented in binary form, in which case the asynchronous counter 21 is a so-called binary ripple downcounter. Furthermore, in such a counter the bits require less power as they are more significant. The counter 21 is programmable, on the one hand by the preset facility and on the other hand by an enable input ena. Counter outputs of the counter 21 are applied, via a current source or so-called gate circuit go, to a charge pump circuit 22. The gate circuit gc serves to supply frequency window signals W1, W2, . . . Wn, n being an integer positive number. The charge pump circuit supplies the control current $I_s$ of the second frequency loop L2. Also shown is the tuning oscillator 6, an output signal of which, having the frequency $f_0$, can be applied, to the programmable counter 21, if desired via a prescaler 23 having a scale factor N. For the operation of the counter 21, reference is made to FIG. 4. If the frequency of the tuning oscillator 6 is too low, the counter residue Cr is positive and if the frequency of the tuning oscillator 6 is exactly equal to the desired frequency $f_x$, the counter residue Cr is zero. The window detection is simple in these two cases. The tuning oscillator 6 is "in-window" only if all counter bits lower than the window bit W1, W2, . . . , Wn are zero at the end of the measuring period $\tau_m$. However, if the frequency of the tuning oscillator 6 is too high, the counter residue Cr is negative. Window detection can then be performed in the above manner, after the counter outputs have been inverted. The clock frequency of the counter 21, controlling the least-significant bit LSB of the counter 21, is either a signal of frequency $f_0$ of the tuning oscillator 6 or a version $f_0/N$ thereof which has been divided by the pre-scaler 23. A sign bit SB, preceding the most-significant bit MSB, of the counter 21 detects whether the counter 21 crosses zero or not. The counting period $\tau_m$ of the counter 21 is determined by the enable signal ena supplied by the control device 16. Inversion of the counter bits, in dependence on the sign bit SB, is performed by a first row of gates gc1 of the gate circuit gc, and window detection is performed by a second row of gates gc2. In the autosearch mode, in which the frequency loop L2 is not closed and no window detection takes place, the gate circuit gc is decoupled from the charge pump circuit 22 and the counter 21 serves to measure the frequency of the tuning oscillator 6. After measurement of the frequency fo of the tuning oscillator 6, the binary representation thereof is applied, via the shift register 20 which then acts as an output shift register and the inverter 24, to the last-channel memory 15. In the event of a change-over to the preset mode, the binary representation provides an "in-window" signal for all frequency windows. The frequency measurement in the autosearch mode is performed as follows, utilizing a one's-complement method. First the counter is filed entirely with logic values "1" and subsequently a count-down cycle is performed. At the end of the count-down cycle, the counter 21 contains the binary representation of the frequency $f_0$ of the tuning oscillator 6 in a one's-complement representation, the sign bit SB being insignificant. The correct frequency is obtained by inversion of the counter outputs, in this case represented as a serial inversion by means of the inverter 24. For storage of the measured frequency in the last-channel memory 15, parallel inversion is to be preferred. In order to avoid a latch-up situation at band edges, the charge pump circuit 22 comprises a band edge detector which applies a band edge signal be to the control device 16. For scanning of the frequency band B in the one or the other direction, the charge pump circuit comprises a control input 25 for supply of an up/down signal ud.

Figure 7:
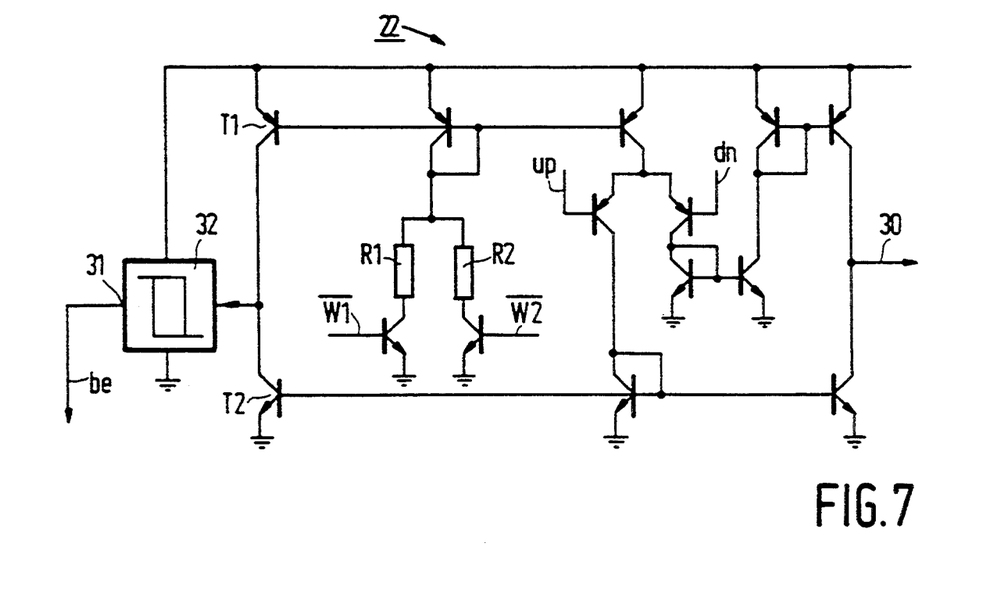
FIG. 7 shows a charge pump circuit for use in the tuning section.

FIG. 7 shows a charge pump circuit 22 for use in the tuning section 12, comprising an output 30 for coupling to the loop filter 8. The charge pump circuit comprises control inputs up and dn for applying a current to the output 30 which has a first and a second current direction, respectively, and window inputs not- (W1) and not-(W2), i.e. a charge pump circuit 22 is shown for a two-window tuning system. The charge pump circuit 22 also comprises an output 31 for supplying the band edge signal be. The charge pump circuit 22 does not supply an output signal if both "in-window" signals W1 and W2 have a logic value "1". The resistors R1 and R2 determine the current intensity of the charge pump circuit 22 in the respective frequency windows W1 and W2. In the preset mode, the signals up and dn are actually the sign bit SB and the inverted sign bit, whereas in the autosearch mode the signals up and dn are generated directly by the keyboard (not shown). For band edge detection, the charge pump circuit 22 comprises a trigger device 32 in combination with the transistors T1 and T2, only the detection of the lower band edge B1 being shown. For detection of the upper band edge B2, the charge pump circuit 22 comprises a similar sub-circuit. It concerns a coarse detection of band edges. For finer detection use can be made of a microprocessor (not shown) included in the receiver 1.

We claim:

1. A radio receiver having a receiving section which includes a first frequency control loop, said first frequency control loop comprising:

a frequency converter for converting a received modulated high frequency signal into a modulated lower frequency signal;

a detector for deriving from the modulated lower frequency signal a detection signal indicative of deviation between the frequency of the received signal and a tuning frequency of the receiver;

a tuning oscillator for producing a tuning signal which is supplied to said frequency converter and which sets the tuning frequency of the receiver; and a first tuning control signal generator for deriving from the detection signal produced by said detector a first tuning control signal for controlling the tuning oscillator so that the frequency of the tuning signal will correspond to the frequency of the received frequency signal;

characterized in that said receiver further has a tuning section which includes a second frequency control loop, said second frequency control loop comprising:

a frequency measuring circuit coupled to said tuning oscillator for measuring the tuning signal frequency and producing a window signal indicative of whether the tuning signal frequency is within a preselected frequency window in relation to a desired tuning signal frequency;

a second tuning control signal generator for producing a second tuning control signal which is supplied to the tuning oscillator to control the tuning signal frequency; and a control unit coupled to said frequency measuring circuit and to said second tuning control signal generator for determining, based on said window signal, when to supply the second tuning control signal to said tuning oscillator to control the tuning signal frequency;

further characterized in that:

said receiving section comprises an in-lock detector coupled to said first tuning control signal generator for deriving from said detection signal an in-lock signal (in-l) indicative of when the frequency of the tuning signal produced by the tuning oscillator has been brought within a capture range relative to the desired tuning frequency; and said control unit is further coupled to said in-lock detector and to said first tuning control signal generator, and based on said in-lock signal (in-l) determines when to supply said first tuning control signal to said tuning oscillator to control the tuning signal frequency.

2. A radio receiver as claimed in claim 1, wherein when the receiver set to operate in a preset mode, the preset mode being characterized in that:

the frequency measuring circuit is preset to a desired tuning signal frequency ($f_x$);

the control unit couples the frequency measuring circuit to the second control signal generator so as to close said second control loop, the second control signal generator producing a second control signal which coarsely changes so as to cause the tuning oscillator to coarsely adjust the frequency of the tuning signal toward the desired tuning signal frequency ($f_x$);

the frequency measuring circuit produces an in-window signal (in-w) when the tuning signal frequency comes within a first predetermined frequency window ($W_1$) around the desired tuning signal frequency and within a frequency band (B) of the receiver;

in response to said in-window signal (in-w), the control unit actuates the first tuning control signal generator to supply said first tuning control signal to the tuning oscillator, so that within the first frequency window ($W_1$) fine tuning of the tuning oscillator is effected primarily by the first tuning control signal, the control unit changing over from coarse tuning to fine tuning on the basis of the in-window (in-w) signal and the in-lock (in-l) signal.

3. A receiver as claimed in claim 2, characterized in that for coarse tuning the frequency measuring circuit provides further successively wider frequency windows (W2, W3) around the first frequency window (W1); the first tuning control signal being substantially active at least within said first frequency window (W1), the second tuning control signal becoming increasingly more active during coarse tuning as the tuning oscillator causes the tuning signal frequency to fall in tuning windows (W3, W2) which extend further from the desired tuning frequency ($f_x$) than the first frequency window (W1).

4. A receiver as claimed in claim 3, characterized in that relative to the first frequency window (W1) the widths of the further frequency windows (W2, W3) constitute a weighted geometrical distribution over the frequency band (B) of the receiver, and the second tuning control signal ($I_s$) is a current the values of which during the different frequency windows (W1, W2, W3) are in the same ratios as the ratios of the weightings of said geometrical distribution.

5. A receiver as claimed in claim 3, characterized in that the frequency measuring circuit measures the frequency of the tuning oscillator during successive measuring periods the durations of which are in proportion to the widths of the applicable frequency windows during said measuring periods.

6. A receiver as claimed in claim 3, characterized in that power to the tuning section is interrupted when the first and second tuning control signals signify to the control unit that the tuning signal frequency is within any of said frequency windows as well as within a capture range of the first tuning control signal generator.

7. A receiver as claimed in claim 6, characterized in that before power to the tuning section is interrupted the last frequency measured by the frequency measuring circuit is stored in a last-channel memory.

8. A receiver as claimed in claim 2, characterized in that when the tuning signal frequency falls outside the first frequency window (W1) the control unit decouples the first tuning control signal generator from the tuning oscillator and couples the second frequency loop to the tuning oscillator.

9. A receiver as claimed in claim 3, characterized in that each of said frequency windows is narrower than half the spacing between successive frequency channels within the frequency band (B) of said receiver.

10. A receiver as claimed in claim 1, wherein when the receiver is set to operate in a search mode to locate any of a plurality of frequency channels within a frequency band (B) of the receiver the search mode being characterized in that:

the control unit de-activates and decouples the frequency measuring circuit from the second tuning control signal generator, thereby enabling the second tuning control signal generator to directly control the tuning oscillator to scan the frequency band (B) of the receiver;

the control unit interrupts the search mode in response to an in-lock signal (in-l) provided by the in-lock detector when the receiver has been tuned to a frequency channel containing a signal; and upon interruption of the search mode, the control unit re-activates the frequency measuring circuit so that the frequency of the tuning oscillator is measured and stored in a last-channel memory; the control unit further being operative, following storage of the frequency of the tuning oscillator, to interrupt power to the tuning section.

* * * * *